United States Patent
Frerichs

[11] Patent Number: 5,280,187
[45] Date of Patent: Jan. 18, 1994

[54] ELECTRICALLY PROGRAMMABLE AND ERASABLE SEMICONDUCTOR MEMORY AND METHOD OF OPERATING SAME

[75] Inventor: Heinz-Peter Frerichs, Hamburg, Fed. Rep. of Germany

[73] Assignee: U.S. Philips Corp., New York, N.Y.

[21] Appl. No.: 747,551

[22] Filed: Aug. 20, 1991

[30] Foreign Application Priority Data

Aug. 21, 1990 [DE] Fed. Rep. of Germany ....... 4026049

[51] Int. Cl.⁵ .................... H01L 29/68; G11C 11/34
[52] U.S. Cl. .................................. 257/315; 365/185
[58] Field of Search ................ 357/23.5, 45; 365/185

*Primary Examiner*—Mark V. Prenty
*Attorney, Agent, or Firm*—Steven R. Biren

[57] ABSTRACT

A semiconductor memory includes non-volatile memory cells which can be electrically programmed and erased by means of tunnel current (EEPROM) with a floating-gate transistor, the cell being arranged in memory cell groups of n lines and m columns each, n cells being connected in series, which serial connection forms the bit line for the columns of a cell block. The control gate is common to m memory cells of one line of the cell block situated next to one another and forms the word line for the line in the memory cell group. The floating gate does not extend over the entire width of the channel, so that in each memory cell a parallel transistor is formed which is connected in parallel to the floating-gate transistor and is controlled only by the control gate, which parallel transistor is conducting during reading for each non-selected cell. As a result, the problem of over-erasing is solved even in the case of short access times, without an additional access transistor being required.

4 Claims, 2 Drawing Sheets

ELECTRICALLY PROGRAMMABLE AND ERASABLE SEMICONDUCTOR MEMORY AND METHOD OF OPERATING SAME

BACKGROUND OF THE INVENTION

The invention relates to a semiconductor memory comprising non-volatile memory cells which are electrically programmable and erasable by means of tunnel currents (EEPROM) and which are arranged in memory cell groups of n lines and m columns each, and comprising memory cells formed in a semiconductor body with source and drain zones and a channel formed between these zones and covered by a gate oxide, a floating gate extending over the gate oxide, and a control gate extending over the floating gate and separated therefrom by a thin dielectric, thus forming a floating-gate transistor, the gate oxide and the thin dielectric being so chosen that electrons can flow towards or from the floating gate owing to Fowler-Nordheim tunnelling current, while the memory cell groups are so formed that the sources and drains of n cells are connected in series and this serial connection forms the bit line for the columns of a cell block, and that the control gate is common to m memory cells of a line of the cell block lying next to one another and forms the word line for the line of the memory cell group.

The invention also relates to a method of operating such a semiconductor memory.

A semiconductor memory of this kind is known from IEEE Journ. of Solid-State-Circuits 24 (1989) 5, 1238-1243. In this known semiconductor memory, problems of over-erasing of memory cells can arise in the case of short access times, which problems are usually solved through the introduction of an additional access transistor. This involves, however, a considerable increase in the surface area of the memory.

SUMMARY OF THE INVENTION

The invention has for its object to solve the problem of over-erasing in a semiconductor memory of the kind mentioned above in the case of short access times, without an appreciable increase in surface area of the memory.

According to the invention, this object is achieved in that the floating gate does not extend over the entire width of the channel, so that a parallel transistor is formed in each memory cell, which parallel transistor is connected in parallel with the floating-gate transistor and is controlled only by the control gate.

In a semiconductor memory constructed in this way, no over-erasing problems occur, even with short access times, while the increase in the required surface area is small.

If, according to a further embodiment of the invention, the regions situated below the gate oxide of the n cells of a column of a memory cell group are interconnected and thus form a programming line which is separated from the source and drain zones, the result is a reduction of the programming voltage to be applied, because the programming voltage applied to each cell of a column is independent of the programming condition of the cells of a column.

It is in addition to program the cells in random fashion.

The invention further relates to a method of operating a semiconductor memory, characterized in that the applied voltages are so chosen that the parallel transistors of the non-selected memory cells are conducting during reading of a memory cell. It is ensured in this way that only the selected cell is read, irrespective of the condition of the memory cells which may be affected by possible over-erasing. The number of the memory cells of a cell block in this case is limited only by the highest permissible access time.

BRIEF DESCRIPTION OF THE DRAWING

An embodiment of the invention is explained in more detail below with reference to the drawing, in which.

DESCRIPTION OF THE PREFERRED EMBODIMENT

Figure 1:
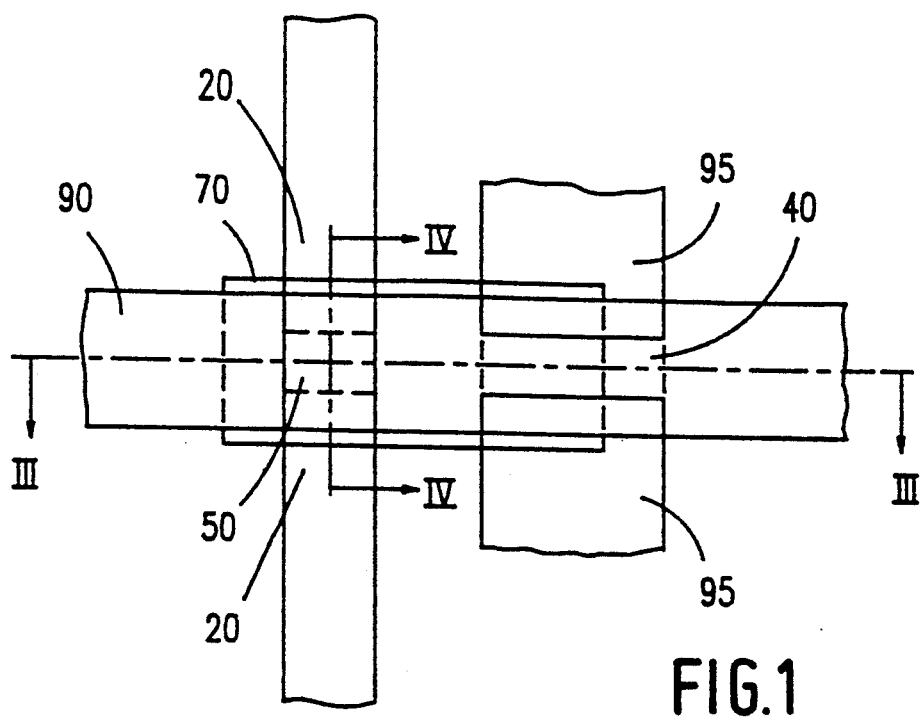
FIG. 1 shows the layout of a memory cell of a semiconductor memory according to the invention.

FIG. 1 shows the layout of a memory cell of a semiconductor memory according to the invention. Cross-sections through this memory cell taken on the lines III—III and IV—IV are given in FIGS. 3 and 4.

The memory cells are realized in a P-conductivity silicon substrate.

First an approximately 500 nm thick oxide 10 is grown on this semiconductor body.

Subsequently, the N+ conducting regions, which are to form the programming line later together with the injector regions, are made by implantation. Oxidation then takes place again, so that both the originally provided oxide 10 and the oxide 30 formed over the regions 20 have a thickness of approximately 800 nm. In the next step, the gate oxide 40 is grown to a thickness of 25 nm. This oxide is then etched away at 60, the injector region 50 is implanted and an approximately 8 nm thick tunnel oxide 60 is grown thereon.

Subsequently, the first polycrystalline silicon layer 70 forming the floating gate is deposited, doped, and structured.

After that, an approximately 40 nm thick dielectric layer 80 of oxynitride and on that a second, approximately 200 to 400 nm thick polycrystalline silicon layer 90, which forms the control gate, are provided, doped, and structured in that order.

Figure 3:
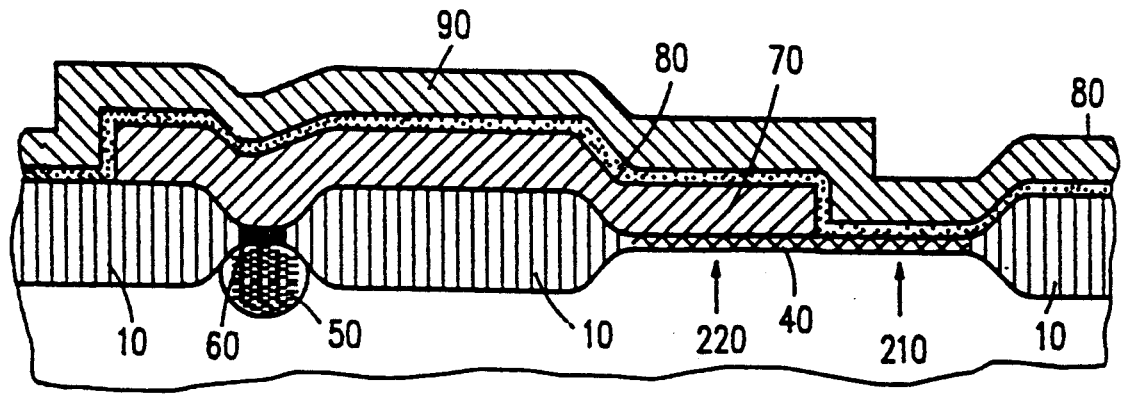
FIG. 3 is a cross-section of a memory cell taken on the line III—III in FIG. 1.
Figure 4:
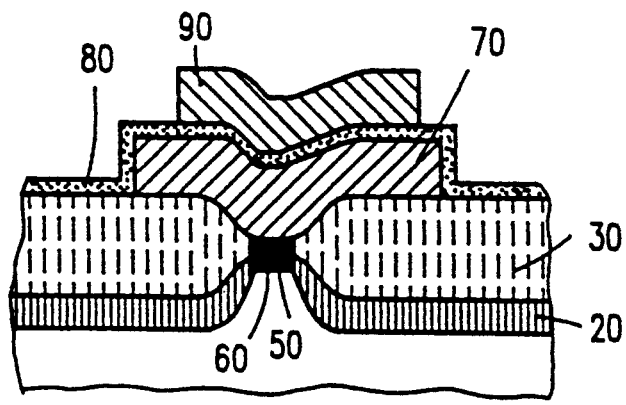
FIG. 4 is a cross-section of a memory cell taken on the line IV—IV in FIG. 1.

The transistor of the memory cell thus manufactured accordingly comprises, as FIG. 3 shows, two transistors connected in parallel, one transistor 220 being formed by the portion of the channel situated below the floating gate 70, and the second, additional transistor 210 being formed by the portion of the channel situated only below the control gate 90.

The source and drain regions 95 of these transistors are provided by implantation after the second polycrystalline silicon layer 90 has been provided in a self-aligned manner. It is alternatively possible, however, to form them by means of a buried layer of the N+ conductivity type.

Figure 2:
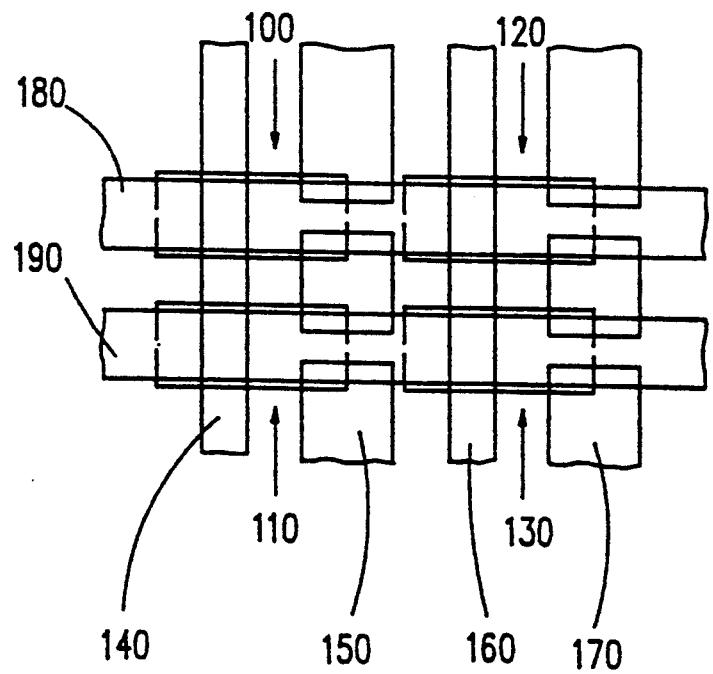
FIG. 2 shows the layout of a memory cell group consisting of 4 memory cells according to FIG. 1.
Figure 5:
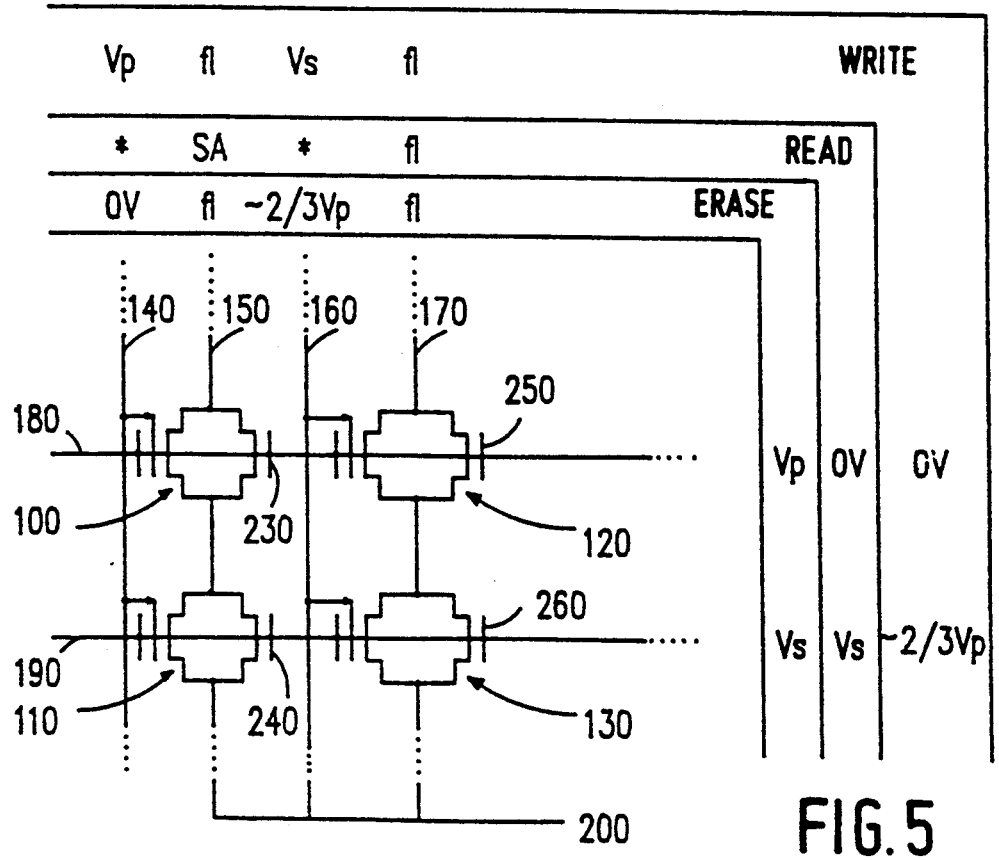
FIG. 5 is the circuit diagram of a memory cell group according to FIG. 2 consisting of 4 memory cells.

FIG. 2 shows a memory cell group of 2×2 memory cells, by way of example only, while FIG. 5 represents the circuit diagram of this group comprising the cells 100, 110, 120, 130.

The bit line for the cells 100 and 110 is denoted by reference numeral 150, and the bit line for the cells 120 and 130 by the reference numeral 170. The cells connected to a bit line are connected in series, so that the source of the cell 100 is simultaneously the drain of the cell 110, etc. The source regions of the final cells of each column are connected to a common source line 200. The word line for the cells 100 and 120 are reference numeral 180, the word line for the cells 110 and 130 has reference numeral 190. Depending on the memory size, 8*× cells are connected to one word line. The programming lines 140 and 160 serve to program/erase the cells 100, 110, and 120, 130, respectively.

During operation of the semiconductor memory, the applied voltages are so chosen that the parallel transistors 240, 260 of the non-selected memory cell lines of a memory cell group are conducting during reading.

If, for example, the cell 100 is to be selected and read, the supply voltage Vs (for example, 5 V) is applied to the word lines (here 190) of the non-selected cells, so that the parallel transistor 240, 260 is rendered conducting independently of the charge condition of the floating-gate transistor. A voltage of 0 V is applied to the word line 180, to which the cell to be read is connected, so that the parallel transistor 230 is rendered non-conducting. A readout amplifier SA is connected to the bit line 150, and the common source line 209 is connected to ground. It now depends on the charge condition of the floating gate of the memory cell 100 whether a current flows (when the gate is positive, corresponding to logic 1), or whether no current flows (when the gate is negative, corresponding to logic 0).

To erase the selected cell 100, the programming voltage Vp (approximately 13 V) is applied to the word line 180 to which this cell is connected, and 0 V to the programming line 140 to which this cell is connected. Owing to the capacitive coupling between the first polycrystalline silicon layer 70, i.e. the floating gate and the second polycrystalline silicon layer 90, i.e. the control gate, a major portion of the applied voltage Vp is drained away via the tunnel oxide 60 (see FIGS. 3 and 4), so that electrons arrive at the floating gate 70 by means of a Fowler-Nordheim tunnel current and give it a negative charge. To prevent the non-selected cells 110, 120 and 130 from being erased simultaneously, the operational voltage Vs is applied to the word line 190 to which only non-selected cells are connected, and approximately ⅔ Vp is applied to the non-selected programming line 160.

To write into the selected cell 100, 0 V is applied to the word line 180 to which this cell is connected, and Vp (approximately 13 V) is connected to the programming line 140 to which this cell is connected. Owing to the capacitive coupling between the first polycrystalline silicon layer 70, the floating gate, and the second polycrystalline silicon layer 90, the control gate, again a major portion of the applied voltage Vp is drained away via the tunnel oxide 60, so that electrons flow away from the floating gate 70, again owing to a Fowler-Nordheim tunnel current, and charge it positively. To prevent the non-selected cells 110, 120 and 130 from being programmed simultaneously, approximately ⅔ Vp is applied to the word line 190 to which only non-selected cells are connected, and the voltage Vs is applied to the programming line 160 for the non-selected cells.

The voltages applied to the word, bit, and programming lines during the three operations: erase, read, write (in the case in which cell 100 is selected) have been written into the margins of FIG. 5. In this Figure, fl means that the relevant line is floating, while * means that the line is floating or is connected to ~⅓ Vs.

I claim:

1. A semiconductor memory comprising non-volatile memory cells which are electrically programmable and erasable by means of tunnel currents (EEPROM) and which are arranged in memory cell groups of lines and columns, and comprising memory cells formed in a semiconductor body with source and drain zones and a channel formed between these zones and covered by a gate oxide, a floating gate extending over the gate oxide, and a control gate extending over the floating gate and separated therefrom by a thin dielectric, thus forming a floating-gate transistor, the gate oxide and the thin dielectric being so chosen that electrons can flow towards or from the floating gate owing to Fowler-Nordheim tunnelling current, while the memory cell groups are so formed that the sources and drains of adjacent cells are connected in series and this serial connection of cells forms the bit line for the columns of a cell block, and the control gate is common to a plurality of memory cells of a line of the cell block lying next to one another and forming the word line for the line of the memory cell group, wherein the floating gate does extends over less than the entire width of the channel, so that a parallel transistor is formed in each memory cell, which parallel transistor is connected in parallel with the floating-gate. transistor and is controlled only by the control gate.

2. A semiconductor memory as claimed in claim 1, wherein
    regions situated below a tunnel oxide of the cells of a column of a memory cell group form injector regions and are interconnected to form a programming line which is separated from the source and drain zones.

3. A semiconductor memory as claimed in claim 2, wherein
    the injector regions of the individual cells of one column are interconnected by means of highly doped regions of the same conductivity type such that a strip-shaped programming line is formed.

4. A method of operating a semiconductor memory as claimed in claim 1 wherein
    applied voltages are chosen such that the parallel transistors of non-selected memory cells are conducting during reading of a memory cell.

* * * * *